US011615978B2

(12) United States Patent
Ogihara

(10) Patent No.: US 11,615,978 B2
(45) Date of Patent: Mar. 28, 2023

(54) METHOD FOR CONTROLLING FLATNESS, METHOD FOR FORMING COATING FILM, APPARATUS FOR CONTROLLING FLATNESS, AND APPARATUS FOR FORMING COATING FILM

(71) Applicant: SHIN-ETSU CHEMICAL CO., LTD., Tokyo (JP)

(72) Inventor: Tsutomu Ogihara, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 92 days.

(21) Appl. No.: 17/198,596

(22) Filed: Mar. 11, 2021

(65) Prior Publication Data

US 2021/0335649 A1 Oct. 28, 2021

(30) Foreign Application Priority Data

Apr. 24, 2020 (JP) .............................. JP2020-077061

(51) Int. Cl.
*H01L 21/683* (2006.01)
*H01L 21/67* (2006.01)

(52) U.S. Cl.
CPC .... *H01L 21/6836* (2013.01); *H01L 21/67253* (2013.01); *H01L 2221/68322* (2013.01); *H01L 2221/68381* (2013.01)

(58) Field of Classification Search
CPC ........... H01L 21/6836; H01L 21/67253; H01L 2221/68322; H01L 2221/68381;

(Continued)

(56) References Cited

U.S. PATENT DOCUMENTS 4,506,184 A * 3/1985 Siddall ..................... B23Q 1/34
279/3
4,666,291 A * 5/1987 Taniguchi ............... G03F 7/703
355/76

(Continued)

FOREIGN PATENT DOCUMENTS

JP 2005-032959 A 2/2005
JP 5596058 B2 9/2014

(Continued)

OTHER PUBLICATIONS

Kim, Tae-il et al., "Stooped Nanohairs: Geometry-Controllable, Unidirectional, Reversible, and Robust Gecko-like Dry Adhesive", Advanced Materials, vol. 21, No. 22, pp. 2276-2281, XP55066817.

(Continued)

*Primary Examiner* — Vu A Vu
(74) *Attorney, Agent, or Firm* — Oliff PLC

(57) ABSTRACT

The present invention is a method for controlling flatness of a wafer including the steps of: providing a holding member having a holding surface including a plurality of segments, where each of the plurality of segments includes a dry adhesive fiber structure; making the holding surface of the holding member adhere to a wafer to make the holding member hold the wafer; obtaining information on flatness of the wafer by measuring flatness of the wafer to; and releasing adhesion of the dry adhesive fiber structures to the wafer in a part of the plurality of segments of the holding surface of the holding member based on the information on flatness. This can provide: a method for controlling flatness by which flatness of a wafer can be controlled sufficiently.

14 Claims, 6 Drawing Sheets

(58) Field of Classification Search
CPC .............. H01L 21/6875; H01L 21/683; H01L 21/6715; H01L 21/67288; H01L 22/12; C09J 2203/326; C09J 5/00; C09J 2301/31; C09J 2301/502; C09J 7/00; G03F 7/70733; G03F 7/7095; G03F 7/707; G03F 7/162; G03F 7/16; G03F 7/70783; G03F 7/7085
USPC ...................................................... 438/464
See application file for complete search history.

(56) References Cited

U.S. PATENT DOCUMENTS

| | | | | |
|---|---|---|---|---|
| 5,563,684 | A | 10/1996 | Stagaman | |
| 7,279,916 | B2* | 10/2007 | Suhir | ............ H01L 23/373 324/755.09 |
| 7,641,840 | B2* | 1/2010 | Choi | ................ B82Y 40/00 264/293 |
| 8,153,254 | B2* | 4/2012 | Arzt | ................. B25J 15/00 264/211.13 |
| 8,206,631 | B1* | 6/2012 | Sitti | ................. B29C 41/20 264/250 |
| 8,398,909 | B1* | 3/2013 | Sitti | ................. B05D 1/005 264/339 |
| 8,524,092 | B2* | 9/2013 | Sitti | ..................... C09J 7/00 216/41 |
| 9,275,914 | B2* | 3/2016 | Sato | .................. H01L 22/26 |
| 9,566,722 | B2 | 2/2017 | Sitti et al. | |
| 10,155,318 | B2* | 12/2018 | Dadkhah Tehrani | ..... B81C 1/00 |
| 10,774,246 | B2* | 9/2020 | Sitti | .................. B29C 33/424 |
| 11,254,566 | B2* | 2/2022 | Dai | .................. B81C 1/00206 |
| 2010/0236476 | A1 | 9/2010 | De Jong | |
| 2012/0237730 | A1* | 9/2012 | Sitti | ................... B82Y 40/00 427/532 |
| 2014/0363610 | A1* | 12/2014 | Sameoto | ............. B29C 43/003 428/92 |
| 2015/0072110 | A1 | 3/2015 | Sitti et al. | |
| 2015/0368519 | A1 | 12/2015 | Sitti et al. | |
| 2020/0057378 | A1 | 2/2020 | Shih et al. | |

FOREIGN PATENT DOCUMENTS

| | | |
|---|---|---|
| JP | 5646395 B2 | 12/2014 |
| JP | 2019-134109 A | 8/2019 |

OTHER PUBLICATIONS

Oct. 1, 2021 Extended Search Report issued in European Application No. 21162139.6.

Murphy, Michael P. et al., "Enhanced Adhesion by Gecko-Inspired Hierarchical Fibrillar Adhesives", Applied Material & Interfaces, vol. 1, No. 4, pp. 849-855, (2009).

Sitti, Metin et al., "Synthetic Gecko Foot-Hair Micro/Nano-Structures As Dry Adhesives", J. Adhesion Sci. Technol., vol. 17, No. 8, pp. 1055-1073, (2003).

* cited by examiner

[FIG. 1]
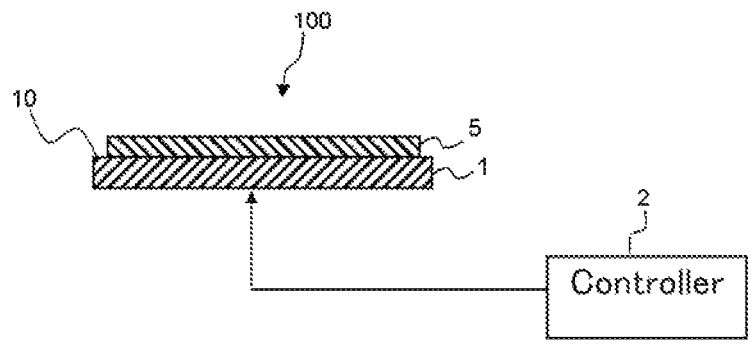
[FIG. 2]
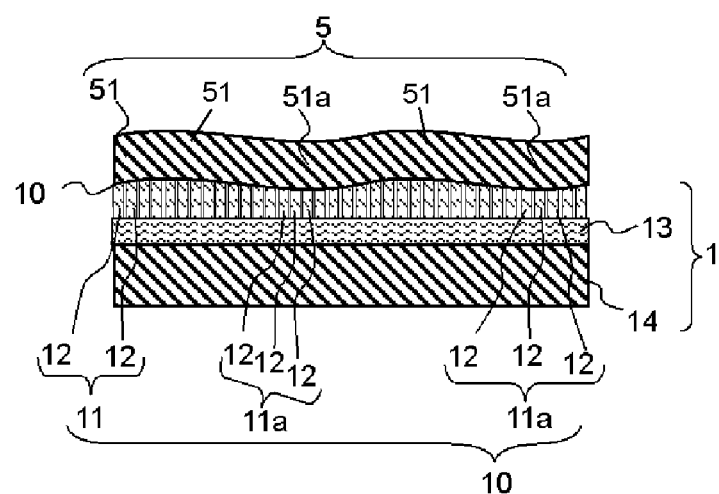
[FIG. 3]
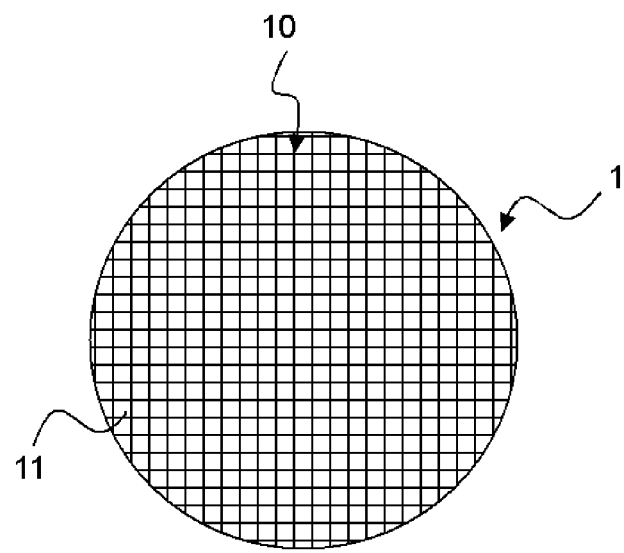

[FIG. 4]
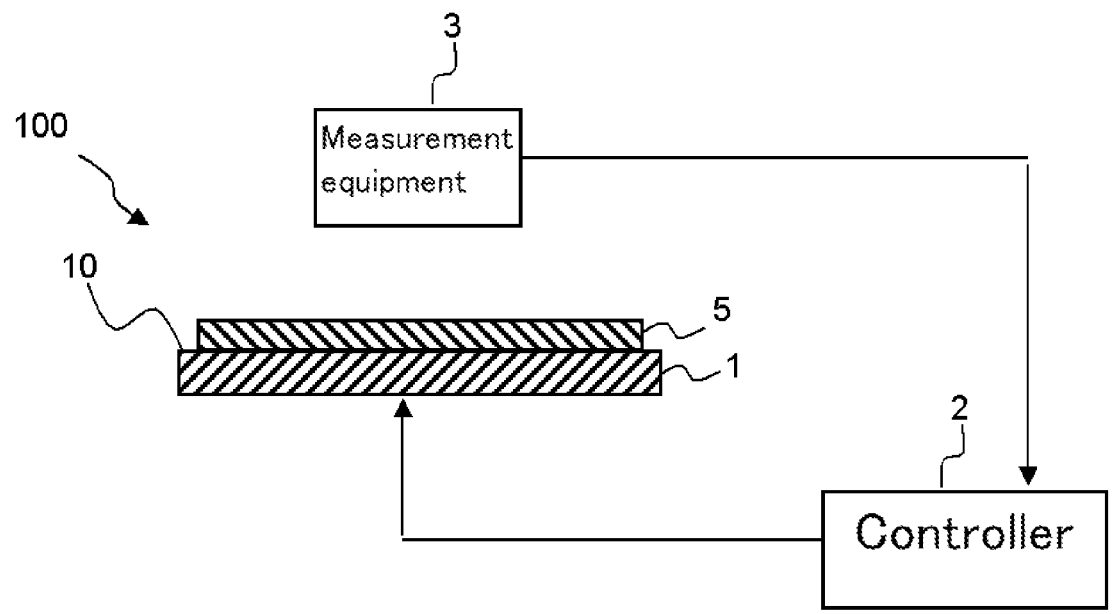
[FIG. 5]
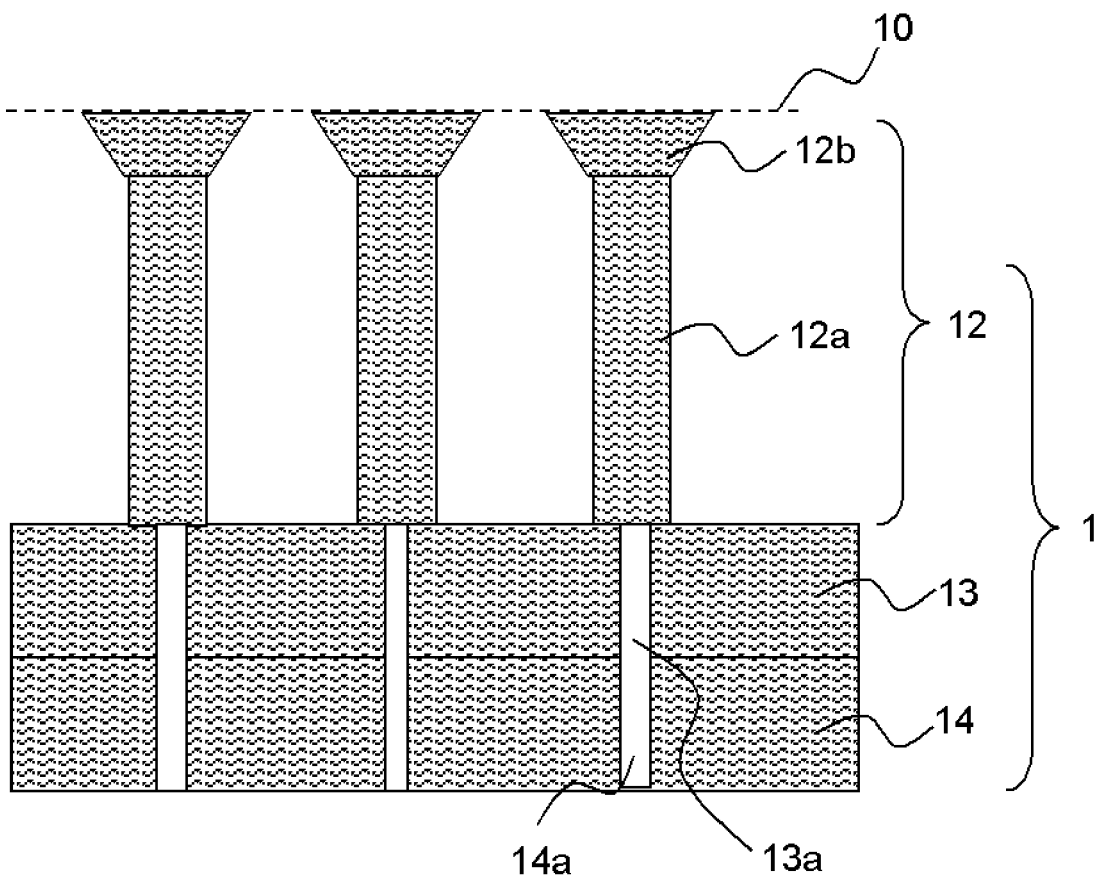

[FIG. 6]
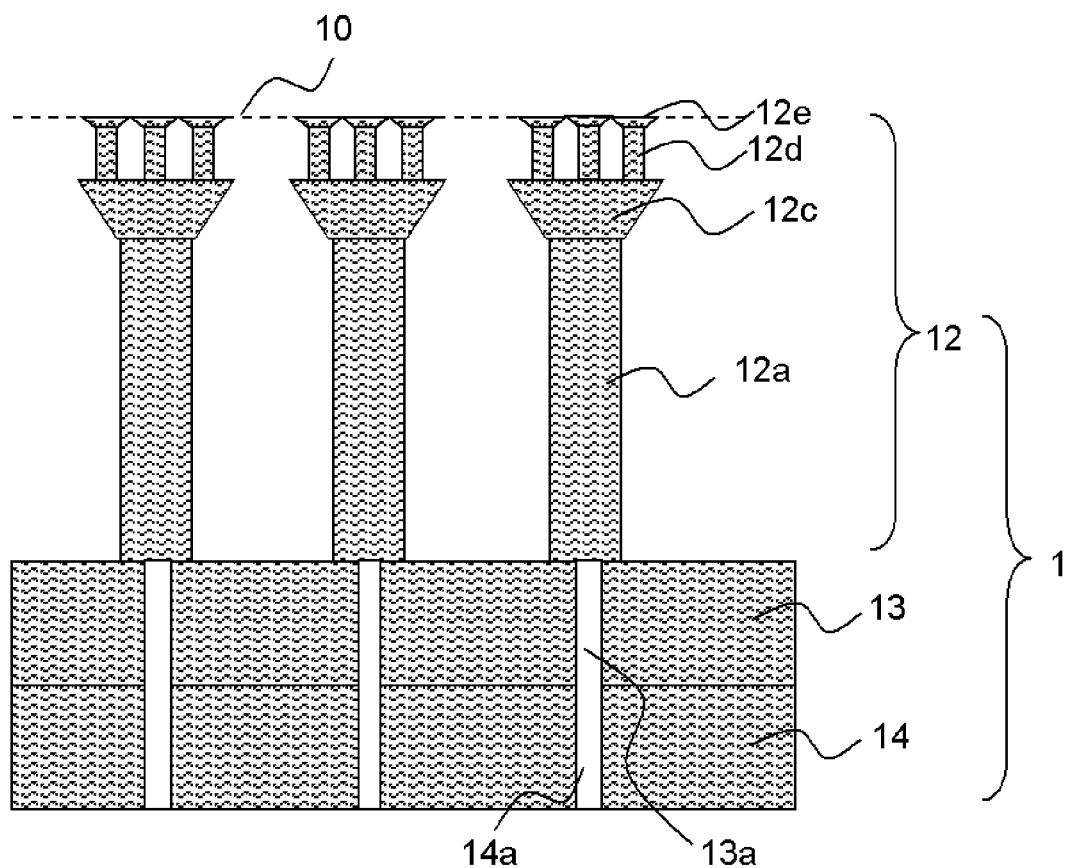
[FIG. 7]
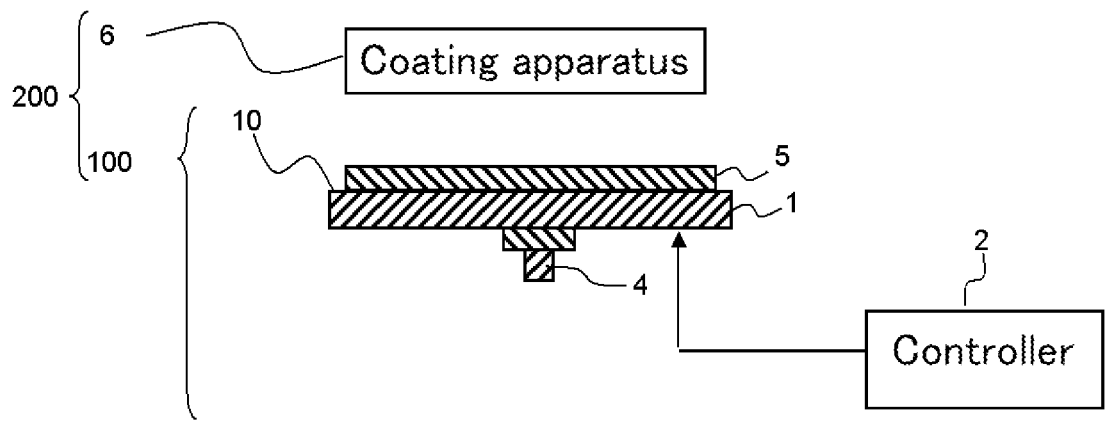

[FIG. 8]
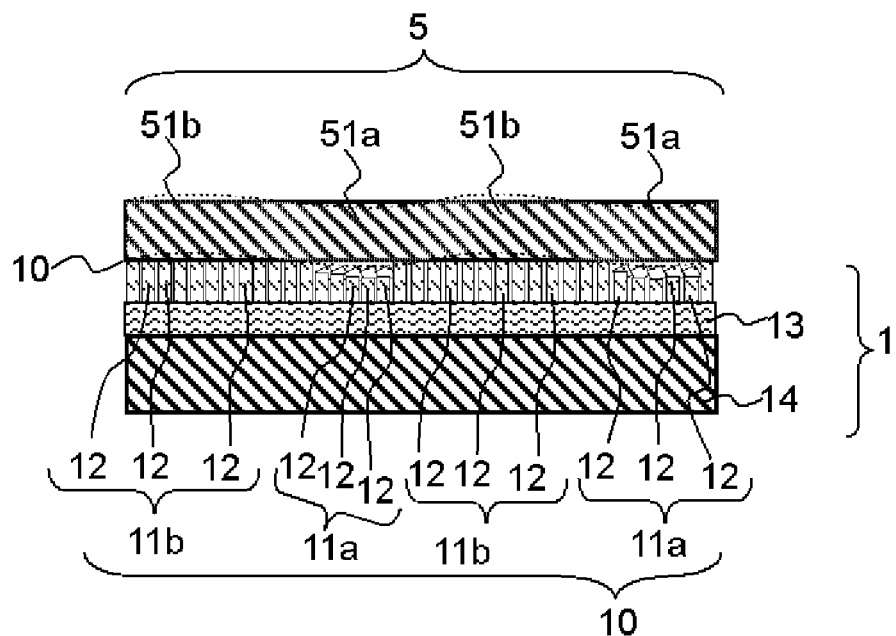
[FIG. 9]
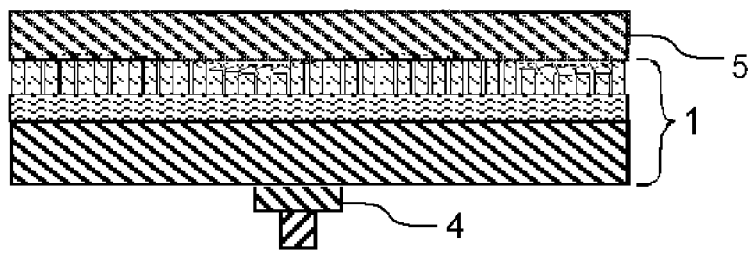
[FIG. 10]
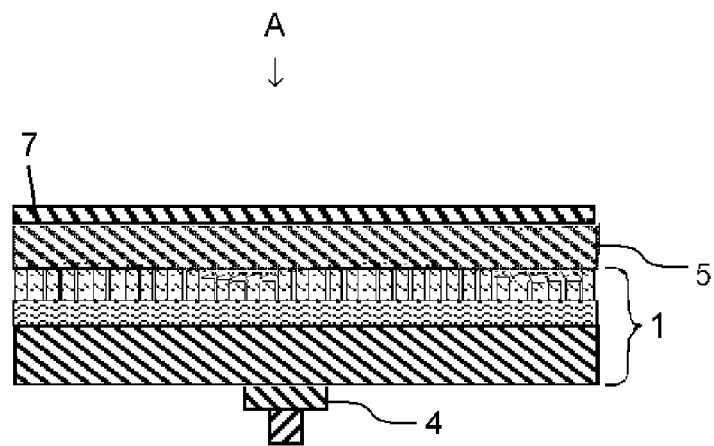

[FIG. 11]
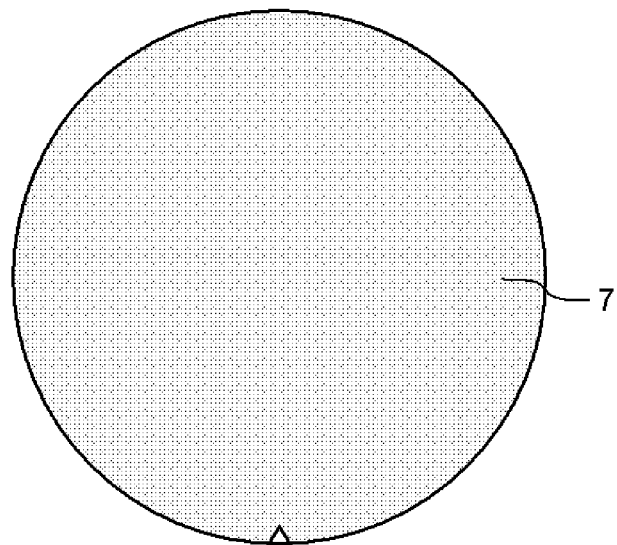
[FIG. 12]
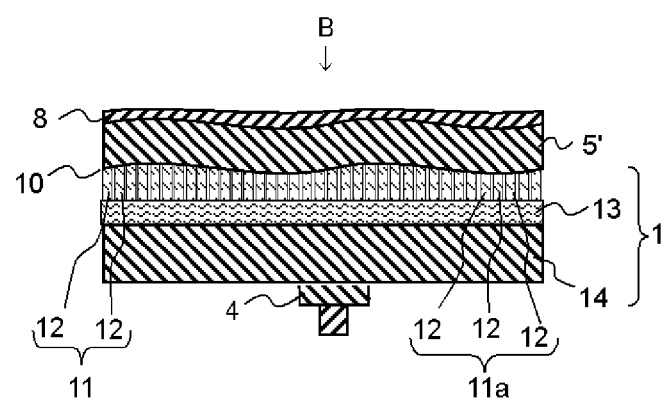
[FIG. 13]
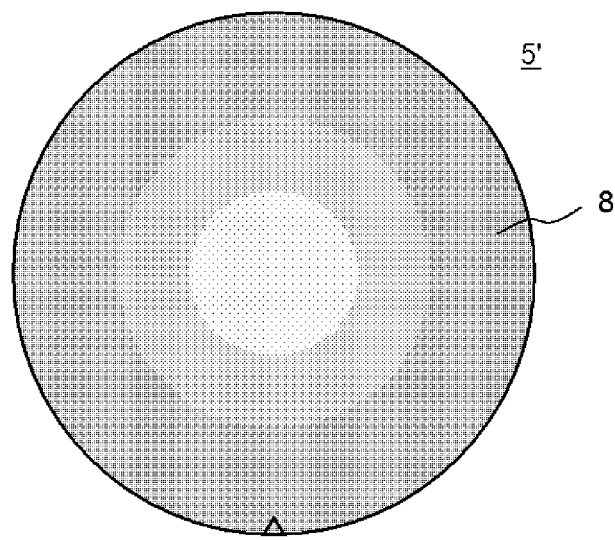

[FIG. 14]
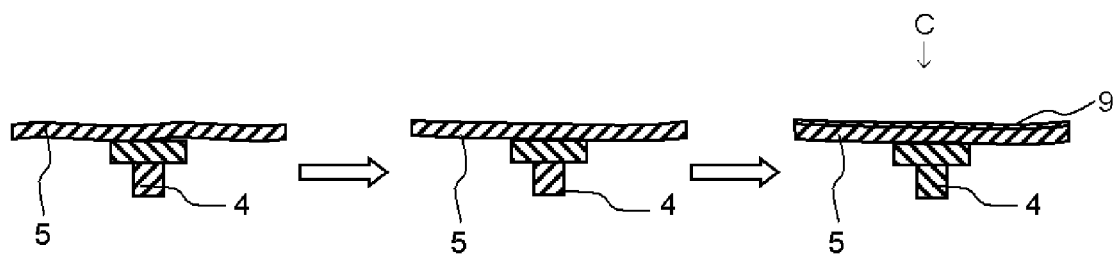
[FIG. 15]
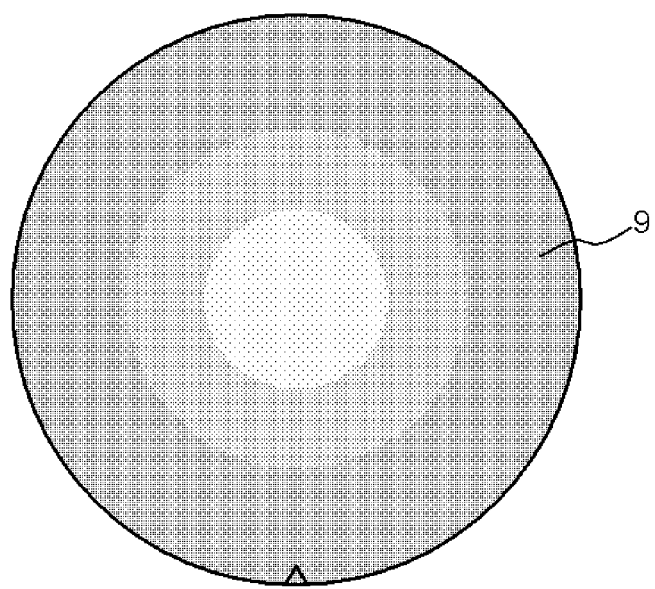

METHOD FOR CONTROLLING FLATNESS, METHOD FOR FORMING COATING FILM, APPARATUS FOR CONTROLLING FLATNESS, AND APPARATUS FOR FORMING COATING FILM

TECHNICAL FIELD

The present invention relates to: a method for controlling flatness; a method for forming a coating film; an apparatus for controlling flatness; and an apparatus for forming a coating film.

BACKGROUND ART

As Large-Scale Integrated circuits (LSIs) advance towards higher integration and higher processing speed, miniaturization in pattern rule has been required. In this situation, various technologies have been developed in regard to how patterning process can be performed more finely and precisely with light sources used in photolithography using a chemically amplified resist, which is a commonly-employed technique at present.

In photolithography using a chemically amplified resist, a wafer, being a body to be processed, is fixed, and a material for forming a chemically amplified resist film is applied on the wafer in the fixed state. To fix the wafer, widely spread methods such as vacuum suction and electrostatic adhesion, and methods using an adhesive film, an adhesive sheet, etc. are known (for example, Patent Documents 1 and 2). However, there has been a problem that if a wafer is fixed using an adhesive film or an adhesive sheet, a part of the adhesive remains on the wafer when the wafer is taken off a supporting element.

As fixing methods that do not use an adhesive or glue, methods of clamping by a vacuum chuck disclosed in Patent Document 3 and capillary force disclosed in Patent Document 4 are employed, for example. These methods can solve the problem of remaining adhesive.

An example of a case where a chemically amplified resist is applied on a wafer with a method for fixing a wafer by vacuum suction using a vacuum chuck will be described with reference to FIG. 14 and FIG. 15. Firstly, as shown in the left side of FIG. 14, a wafer 5 is placed on a vacuum chuck 4. Next, as shown in the middle of FIG. 14, the vacuum chuck 4 is operated to fix the wafer 5. Next, as shown in the right side of FIG. 14, the wafer 5 is rotated in a state of being fixed with the vacuum chuck 4, and a composition for forming a chemically amplified resist film 9 is spin-coated on the wafer 5 to form a chemically amplified resist film 9. FIG. 15 is a plane view of the chemically amplified resist film 9 seen from direction C in FIG. 14.

A non-uniform coating film occurs unavoidably in a chemically amplified resist film 9 formed in this manner, as shown in FIG. 14 and FIG. 15. This is sometimes caused by the wafer 5 coated with the chemically amplified resist film 9 not having sufficient flatness. If the film thickness is non-uniform, an area where an exposure apparatus is out of focus partially occurs during a patterning process by photolithography. Thus, variation occurs in exposure pattern dimension in this portion.

Accordingly, to perform patterning process finely and precisely by photolithography, it has been desired to develop a technology by which it is possible to reduce variation in coating film thickness that occurs when applying a coating film such as a chemically amplified resist film.

This is not limited to cases where a coating film is formed, and when a wafer is held and processed, the wafer surface becomes processed non-uniformly if the wafer is not held flatly. Therefore, how a wafer can be held flatly is an issue.

CITATION LIST

Patent Literature

Patent Document 1: JP 5646395 B
Patent Document 2: JP 2019-134109 A
Patent Document 3: JP 2005-32959 A
Patent Document 4: JP 5596058 B
Patent Document 5: US 2015/0368519 A1
Patent Document 6: U.S. Pat. No. 9,566,722 B2
Patent Document 7: US 2015/0072110 A1

Non Patent Literature

Non Patent Document 1: APPLIED MATERIAL & INTERFACES, Vol. 1, No. 4, pp. 849-855, 2009
Non Patent Document 2: J. Adhesion Sci. Technol., Vol. 17, No. 8, pp. 1055-1073

SUMMARY OF INVENTION

Technical Problem

The present invention has been made to solve the above-described problems, and an object thereof is to provide: a method for controlling flatness by which flatness of a wafer can be controlled sufficiently; and an apparatus for controlling flatness on which this method can be performed. In addition, an object of the present invention is to provide: a method for forming a coating film that makes it possible to reduce variation in coating film thickness that may occur when applying a coating film; and an apparatus for forming a coating film on which this method can be performed.

Solution to Problem

To achieve the object, the present invention provides a method for controlling flatness of a wafer comprising the steps of:

providing a holding member having a holding surface comprising a plurality of segments, wherein each of the plurality of segments comprises a dry adhesive fiber structure;

making the holding surface of the holding member adhere to a wafer to make the holding member hold the wafer;

obtaining information on flatness of the wafer by measuring flatness of the wafer; and releasing adhesion of the dry adhesive fiber structures to the wafer in a part of the plurality of segments of the holding surface of the holding member based on the information on flatness.

According to the inventive method for controlling flatness, flatness of the wafer can be controlled sufficiently by partially releasing adhesion of the dry adhesive fiber structures to the wafer based on the information on flatness of the wafer. By using a wafer whose flatness is controlled by the inventive method for controlling flatness, occurrence of variation in coating film thickness can be reduced when a composition for forming a coating film, for example, is applied on this wafer.

The step of obtaining the information on flatness can be a step of measuring flatness of the wafer before being held by the holding member to obtain the information on flatness.

Alternatively, the step of obtaining the information on flatness can be a step of measuring flatness of the wafer in a state of being held by the holding member to obtain the information on flatness.

As described, the information on flatness of the wafer used for controlling flatness may be information before being held by the holding member or may be information in the state of being held by the holding member.

As the dry adhesive fiber structure, a dry adhesive fiber structure comprising a plurality of microfibers and/or a plurality of nanofibers is preferably used.

By using a dry adhesive fiber structure including a plurality of microfibers and/or a plurality of nanofibers, partial release of the adhesion of the dry adhesive fiber structures to the wafer can be performed more easily.

Preferably, the wafer comprises a plurality of divided regions;

the information on flatness of the wafer comprises information on flatness of each of the plurality of divided regions of the wafer;

the method further comprises a step of judging a region to be controlled that projects towards the holding surface of the holding member out of the plurality of divided regions of the wafer based on the information on flatness; and the step of releasing adhesion is a step of releasing adhesion of the dry adhesive fiber structures to the wafer in a segment corresponding to the region to be controlled out of the plurality of segments of the holding member.

By releasing adhesion of the dry adhesive fiber structures to the wafer in a segment corresponding to the region to be controlled of the wafer out of the plurality of segments of the holding surface of the holding member, unevenness of the wafer can be reduced further. Thus, flatness of the wafer can be controlled more precisely.

Furthermore, the present invention provides a method for forming a coating film on a wafer comprising the steps of:

controlling flatness of the wafer by the inventive method for controlling flatness; and applying a composition for forming a coating film on the wafer having the controlled flatness.

By applying a composition for forming a coating film on a wafer whose flatness is controlled by the inventive method for controlling flatness, occurrence of variation in coating film thickness can be reduced when a composition for forming a coating film is applied.

The method preferably further comprises the steps of:

providing a reference wafer and making the holding surface of the holding member adhere to an entire surface of the reference wafer facing the holding member to make the holding member hold the reference wafer;

obtaining information on flatness of the reference wafer by measuring flatness of the reference wafer in a state of being held by the holding member;

applying a composition for forming a coating film on the reference wafer in the state of being held by the holding member to form a reference coating film; and obtaining information on a surface state of the reference coating film, wherein in the step of releasing adhesion, adhesion of the dry adhesive fiber structures to the wafer is preferably released in a part of the plurality of segments of the holding surface of the holding member based on information on flatness of the reference wafer and information on the surface state of the reference coating film in addition to the information on flatness of the wafer.

According to such a method for forming a coating film, flatness of the wafer can be controlled even more sufficiently in accordance with coating conditions or the coating apparatus, for example. Thus, variation in the coating film thickness of the coating film formed on the wafer can be further suppressed, and a desired coating film can be formed with excellent reproducibility.

The composition for forming a coating film is preferably applied by spin-coating.

Occurrence of variation in coating film thickness can be further reduced by spin-coating the composition for forming a coating film.

A composition for forming a resist film can be used as the composition for forming a coating film.

When a composition for forming a resist film is used as the composition for forming a coating film, a uniform resist film having no variation in coating film thickness can be formed.

Furthermore, the present invention provides an apparatus for controlling flatness of a wafer comprising:

a holding member having a holding surface comprising a plurality of segments, wherein each of the plurality of segments comprises a dry adhesive fiber structure, and the holding member is configured to hold a wafer by making the holding surface adhere to the wafer; and a controller configured to release adhesion of the dry adhesive fiber structures to the wafer in a part of the plurality of segments of the holding surface of the holding member based on information on flatness of the wafer.

According to the inventive apparatus for controlling flatness, adhesion of the dry adhesive fiber structures to the wafer can be partially released based on the information on flatness of the wafer, and flatness of the wafer can be controlled sufficiently. By using a wafer whose flatness is controlled by the use of the inventive apparatus for controlling flatness, occurrence of variation in coating film thickness can be reduced when a composition for forming a coating film is applied on this wafer, for example.

The inventive apparatus for controlling flatness can further comprise a measurement equipment configured to measure flatness of the wafer to obtain the information on flatness of the wafer.

With the measurement equipment, such an apparatus for controlling flatness can obtain information on flatness of the wafer before being held by the holding member and/or obtain information on flatness of the wafer in a state of being held by the holding member.

The dry adhesive fiber structure preferably comprises a plurality of microfibers and/or a plurality of nanofibers.

An apparatus for controlling flatness including a dry adhesive fiber structure including a plurality of microfibers and/or a plurality of nanofibers makes it possible to partially release the adhesion of the dry adhesive fiber structures to the wafer more easily.

Preferably, the wafer comprises a plurality of divided regions;

the information on flatness of the wafer comprises information on flatness of each of the plurality of divided regions of the wafer; and the controller is configured to judge a region to be controlled that projects towards the holding surface of the holding member out of the plurality of divided regions of the wafer based on the information on flatness, and to release adhesion of the dry adhesive fiber structures to the wafer in a segment corresponding to the region to be controlled out of the plurality of segments of the holding member.

An apparatus for controlling flatness provided with the controller configured to release adhesion of the dry adhesive fiber structures to the wafer in a segment corresponding to the region to be controlled of the wafer out of the plurality of segments of the holding surface of the holding member makes it possible to further reduce unevenness of the wafer. Thus, flatness of the wafer can be controlled more precisely.

Furthermore, the present invention provides an apparatus for forming a coating film, comprising:
the inventive apparatus for controlling flatness; and
a coating apparatus configured to apply a composition for forming a coating film on the wafer held and made flat by the apparatus for controlling flatness.

An apparatus for forming a coating film provided with the inventive apparatus for controlling flatness and a coating apparatus configured as described above makes it possible to reduce occurrence of variation in coating film thickness when a composition for forming a coating film is applied.

Preferably, the controller is configured to release adhesion of the dry adhesive fiber structure to the wafer in a part of the plurality of segments of the holding surface of the holding member based on information on flatness of a reference wafer and information on a surface state of a reference coating film in addition to the information on flatness of the wafer;
the information on flatness of the reference wafer is information on flatness of the reference wafer in a state where an entire surface of the reference wafer facing the holding member is adhered to the holding surface of the holding member; and
the information on the surface state of the reference coating film is information on a surface state of a coating film formed by using the coating apparatus on the reference wafer in the state where the entire surface of the reference wafer facing the holding member is adhered to the holding surface of the holding member.

By using such an apparatus for forming a coating film, flatness of the wafer can be controlled even more sufficiently in accordance with coating conditions or the coating apparatus, for example. Thus, variation in the coating film thickness of the coating film formed on the wafer can be further suppressed, and a desired coating film can be formed with excellent reproducibility.

Advantageous Effects of Invention

As described above, the inventive method for controlling flatness makes it possible to control flatness of a wafer sufficiently. When a coating film is formed by applying, for example, a composition for forming a coating film on a wafer whose flatness has been controlled in this manner, occurrence of variation in coating film thickness when applying the composition can be reduced. In addition, by forming a coating film employing the inventive method for controlling flatness, a resist film with little variation in coating film thickness can be formed. When a resist film with little variation in coating film thickness is used in photolithography, patterning process with no line width variation can be performed.

Furthermore, the inventive method for controlling flatness can be performed on the inventive apparatus for controlling flatness. Furthermore, according to the inventive method for forming a coating film, a coating film is formed by applying a composition for forming a coating film on a wafer whose flatness has been controlled so that occurrence of variation in coating film thickness when applying the composition can be reduced. In addition, the inventive method for forming a coating film can be performed on the inventive apparatus for forming a coating film.

BRIEF DESCRIPTION OF DRAWINGS

FIG. 1 is a schematic cross-sectional view showing an example of the inventive apparatus for controlling flatness.

FIG. 2 is a schematic cross-sectional view of a holding member included in the apparatus for controlling flatness of FIG. 1.

FIG. 3 is a schematic plane view of the holding member shown in FIG. 1 and FIG. 2.

FIG. 4 is a schematic cross-sectional view showing a different example of the inventive apparatus for controlling flatness.

FIG. 5 is a schematic cross-sectional view of an example of a holding member that the inventive apparatus for controlling flatness can include.

FIG. 6 is a schematic cross-sectional view of a different example of a holding member that the inventive apparatus for controlling flatness can include.

FIG. 7 is a schematic cross-sectional view showing an example of the inventive apparatus for forming a coating film.

FIG. 8 is a schematic cross-sectional view of an example of a state where adhesion of the holding member to the wafer shown in FIG. 2 is partly released.

FIG. 9 is a schematic cross-sectional view showing a step in an example of the inventive method for forming a coating film.

FIG. 10 is a schematic cross-sectional view of a wafer and a coating film after a step of applying a composition for forming a coating film in an example of the inventive method for forming a coating film.

FIG. 11 is a plane view of the coating film seen from direction A in FIG. 10.

FIG. 12 is a schematic cross-sectional view of a reference wafer in a state of being held by adhesion of a holding member of an apparatus for controlling flatness in an example of the present invention and a reference coating film formed thereon.

FIG. 13 is a plane view of the reference coating film seen from direction B in FIG. 12.

FIG. 14 is a schematic cross-sectional view showing a series of steps of a conventional method for forming a coating film.

FIG. 15 is a plane view of a resist film seen from direction C in FIG. 14.

DESCRIPTION OF EMBODIMENTS

As described above, to perform patterning process finely and precisely by photolithography, it has been desired to develop a method by which flatness of a wafer can be controlled sufficiently.

The present inventor has earnestly studied the above-described problems, and found out that by using dry adhesive fiber structures as a holding member, while at the same time, partially releasing adhesion of the dry adhesive fiber structures to the wafer based on information on flatness of the wafer, being the object to be controlled, flatness of the wafer can be controlled sufficiently, and completed the present invention.

That is, the present invention is a method for controlling flatness of a wafer comprising the steps of:

providing a holding member having a holding surface comprising a plurality of segments, wherein each of the plurality of segments comprises a dry adhesive fiber structure;

making the holding surface of the holding member adhere to a wafer to make the holding member hold the wafer;

obtaining information on flatness of the wafer by measuring flatness of the wafer; and releasing adhesion of the dry adhesive fiber structures to the wafer in a part of the plurality of segments of the holding surface of the holding member based on the information on flatness.

In addition, the present invention is a method for forming a coating film on a wafer comprising the steps of:

controlling flatness of the wafer by the inventive method for controlling flatness; and applying a composition for forming a coating film on the wafer having the controlled flatness.

In addition, the present invention is an apparatus for controlling flatness of a wafer comprising:

a holding member having a holding surface comprising a plurality of segments, wherein each of the plurality of segments comprises a dry adhesive fiber structure, and the holding member is configured to hold a wafer by making the holding surface adhere to the wafer; and a controller configured to release adhesion of the dry adhesive fiber structures to the wafer in a part of the plurality of segments of the holding surface of the holding member based on information on flatness of the wafer.

In addition, the present invention is an apparatus for forming a coating film, comprising:

the inventive apparatus for controlling flatness; and a coating apparatus configured to apply a composition for forming a coating film on the wafer held and made flat by the apparatus for controlling flatness.

Hereinafter, the present invention will be described in detail, but the present invention is not limited thereto.

<Apparatus for Controlling Flatness>

Firstly, the inventive apparatus for controlling flatness will be described.

The inventive apparatus for controlling flatness is an apparatus for controlling flatness of a wafer including:

a holding member having a holding surface including a plurality of segments, where each of the plurality of segments includes a dry adhesive fiber structure, and the holding member is configured to hold a wafer by making the holding surface adhere to the wafer; and a controller configured to release adhesion of the dry adhesive fiber structures to the wafer in a part of the plurality of segments of the holding surface of the holding member based on information on flatness of the wafer.

According to the inventive apparatus for controlling flatness, adhesion of the dry adhesive fiber structures to the wafer can be partially released based on the information on flatness of the wafer, and flatness of the wafer can be controlled sufficiently. By using a wafer whose flatness is controlled by the inventive apparatus for controlling flatness, occurrence of variation in coating film thickness can be reduced when a composition for forming a coating film is applied on this wafer.

Note that control of the flatness of the wafer by the present invention is not limited to enhancing flatness of the wafer, and also includes, for example, adjusting flatness of the wafer in order to obtain a desired coating film thickness with excellent reproducibility when applying a composition for forming a coating film on a wafer to form a coating film. That is, according to the present invention, flatness of the wafer can be also controlled in such a way that a desired unevenness occurs on the wafer as necessary.

Next, an embodiment of the inventive apparatus for controlling flatness will be described in detail with reference to the drawings.

FIG. 1 is a schematic cross-sectional view showing an example of the inventive apparatus for controlling flatness. FIG. 2 is a schematic cross-sectional view of a holding member included in the apparatus for controlling flatness of FIG. 1. FIG. 3 is a schematic plane view of the holding member shown in FIG. 1 and FIG. 2.

The apparatus 100 for controlling flatness shown in FIG. 1 is provided with a holding member 1 and a controller 2. The holding member 1 has a holding surface 10 facing upwards.

As shown in FIG. 2 and FIG. 3, the holding surface 10 of the holding member 1 includes a plurality of segments 11. In FIG. 3, each segment 11 is distinguished by lines, but clear borders are not necessary. Each of the segments 11 is provided with a dry adhesive fiber structure 12 shown in FIG. 2. The dry adhesive fiber structures 12 are supported by a base 13. The base 13 is supported by a carrier 14. The holding member 1 is constituted of the dry adhesive fiber structures 12, the base 13, and the carrier 14. Details of the dry adhesive fiber structures 12, the base 13, and the carrier 14 will be given below.

The dry adhesive fiber structures 12 can adhere to an object that comes into contact with the tips, and can release adhesion to the object (attach and remove). The tips of the plurality of dry adhesive fiber structures 12 constitute the holding surface 10. The holding member 1 includes such dry adhesive fiber structures 12, so that the holding member 1 is configured to make the holding surface 10 adhere to the wafer 5. Furthermore, each of the plurality of segments 11 of the holding surface 10 of the holding member 1 includes a dry adhesive fiber structure 12, so that adherence and release of the dry adhesive fiber structures 12 to the wafer 5 in each segment 11 can be performed independently of other segments 11.

The controller 2 is configured to release adhesion of the dry adhesive fiber structures 12 to the wafer 5 in a part of the plurality of segments 11 of the holding surface 10 of the holding member 1 based on the information on flatness of the wafer 5. The form of the connection between the controller 2 and the holding member 1 is not particularly limited.

The apparatus for controlling flatness 100 shown in FIG. 1 includes such a holding member 1 and controller 2, so that adhesion of the dry adhesive fiber structures to the wafer can be partially released based on the information on flatness of the wafer, and flatness of the wafer can be controlled sufficiently.

Furthermore, for example, the controller 2 can be configured to release adhesion of the dry adhesive fiber structures 12 to the wafer 5 in a part of the plurality of segments 11 of the holding surface 10 of the holding member 1 based on information on flatness of a reference wafer and information on a surface state of a reference coating film in addition to the information on flatness of the wafer 5.

The information on flatness of the reference wafer used here is information on flatness of the reference wafer in a state where an entire surface of the reference wafer facing the holding member 1 is adhered to the holding surface 10 of the holding member 1. In addition, the information on the surface state of the reference coating film is information on a surface state of a coating film formed on the reference wafer in a state where the entire surface of the reference wafer facing the holding member 1 is adhered to the holding surface 10 of the holding member 1. Details of the reference wafer and the reference coating film will be given below.

A controller 2 thus configured can use the surface state of the reference coating film as information as a fingerprint. Such a controller 2 can release adhesion of the dry adhesive fiber structures 12 to the wafer 5 in a part of the plurality of segments 11 of the holding surface 10 of the holding member 1 to control flatness of the wafer 5 so that a coating film having a desired surface state can be formed on the wafer 5, based on the information on flatness of the wafer 5, the information on flatness of the reference wafer, and the information on the surface state of the reference coating film. The desired surface state referred to here is, for example, a surface state that has had a point that should be corrected from the surface state of the reference coating film, for example, coating distribution corrected.

An apparatus 100 for controlling flatness including such a controller 2 can control flatness of the wafer 5 even more sufficiently in accordance with coating conditions or the coating apparatus, for example. In this manner, by using such an apparatus 100 for controlling flatness, variation in the coating film thickness of the coating film formed on the wafer 5 can be further suppressed, and a desired coating film can be formed with excellent reproducibility.

The inventive apparatus 100 for controlling flatness can further include a measurement equipment 3 shown in FIG. 4 configured to measure flatness of the wafer 5 to obtain the information on flatness of the wafer 5.

The measurement equipment 3 may be configured to obtain the information on flatness of the wafer 5 before being held by the holding member 1, or may be configured to obtain the information on flatness of the wafer 5 in a state of being held by the holding member 1. The method for obtaining the information on flatness of the wafer 5 with the measurement equipment 3 is not particularly limited. For example, the measurement equipment 3 can obtain information on flatness of the wafer 5 with an optical interference type flatness tester.

Note that the inventive apparatus for controlling flatness does not have to include a measurement equipment. In this case, the information on flatness of the wafer can be obtained using a measurement equipment other than the inventive apparatus for controlling flatness.

The wafer 5 can include a plurality of divided regions 51 as shown in FIG. 2. In this case, the information on flatness of the wafer 5 can include information on flatness of each of the plurality of divided regions 51. Note that each of the divided regions 51 do not need to have clear borders as shown in FIG. 2. In addition, in FIG. 2, the wafer 5 has been shown having large waves for explanation, but the flatness of the wafer 5, being the object to be controlled, is not particularly limited.

Furthermore, in this case, the controller 2 is preferably configured to judge a region to be controlled 51a that projects towards the holding surface 10 of the holding member 1 out of the plurality of divided regions 51 of the wafer 5 based on the information on flatness of the wafer 5, and to release adhesion of the dry adhesive fiber structures 12 to the wafer 5 in a segment 11a corresponding to the region to be controlled 51a out of the plurality of segments 11 of the holding member 1. Such a controller 2 is provided, so that unevenness of the wafer can be reduced further, and thus, flatness of the wafer can be controlled more precisely.

Next, an example of the holding member included in the inventive apparatus for controlling flatness will be described in detail with reference to the drawings. However, the holding member included in the inventive apparatus for controlling flatness is not limited to the example described below as long as the holding member has a holding surface including a plurality of segments, where each of the plurality of segments includes a dry adhesive fiber structure, and the holding member is configured to hold a wafer by making the holding surface adhere to the wafer.

FIG. 5 is a schematic cross-sectional view of an example of a holding member that the inventive apparatus for controlling flatness can include. FIG. 5 is a schematic cross-sectional view of a part of the holding member 1 shown in FIG. 2.

The holding member 1 includes a carrier 14, a base 13 supported on the carrier 14, and dry adhesive fiber structures 12 supported on the base 13.

The dry adhesive fiber structures 12 include a plurality of fibers 12a. The plurality of fibers 12a may include a plurality of nanofibers, may include a plurality of microfibers, or may include both. That is, the dry adhesive fiber structures 12 can include a plurality of microfibers and/or a plurality of nanofibers.

Each of the plurality of fibers 12a shown in FIG. 5 are provided with a spatula-shaped tip 12b. A plurality of tips 12b constitute the holding surface 10. Molecular surface force such as van der Waals force acts between these tips 12b and an object in contact with the tips 12b, and dry adhesion of the tips 12b to the object is possible. Capillary action is also sometimes involved in this adhesion.

The form of the fibers 12a included in the dry adhesive fiber structures 12 can be changed in various ways. For example, as shown in FIG. 6, there may further be a plurality of fibers 12d present on the tip 12c of each fiber 12a. The diameter of the fibers 12d are smaller than the diameter of the fibers 12a supporting the fibers 12d. In addition, each of the plurality of fibers 12d includes a spatula-shaped tip 12e. These tips 12e constitute the holding surface 10. The structure shown in FIG. 6 can be called a hierarchy structure, for example.

The adhesive property of the dry adhesive fiber structures 12 can be controlled by, for example, the diameter of the fibers 12a, the shape of the tips 12b, the diameter of the fibers 12d, and/or the shape of the tips 12e.

The base 13 is united with the plurality of fibers 12a to support the plurality of fibers 12a. The base 13 is provided with penetrating holes 13a in positions each of which corresponds to each of the plurality of fibers 12a. In other embodiments, the base 13 may be separate from the plurality of fibers 12a.

The carrier 14 supports the base 13. The carrier 14 is provided with penetrating holes 14a each of which communicates with each of the penetrating holes 13a of the base 13.

For example, the adhesion and release thereof between the fibers 12a and the wafer 5 can be controlled for each fiber 12a by applying stress to the fibers 12a and/or relaxing or eliminating the stress on the fibers 12a, through the each penetrating hole 13a in the base 13 and the each penetrating hole 14a in the carrier 14.

That is, the inventive apparatus for controlling flatness can perform the partial release of the adhesion of the dry adhesive fiber structures to the wafer more easily by including dry adhesive fiber structures including a plurality of microfibers and/or a plurality of nanofibers.

The dry adhesive fiber structures 12 exemplified above are disclosed in Patent Document 5 and Non Patent Document 1, for example. In addition, methods for manufacturing the dry adhesive fiber structures 12 exemplified above include, for example, methods disclosed in Patent Documents 6 and 7, and Non Patent Document 2. Note that these documents make no mention of controlling the adhesion of the dry adhesive fiber structures in order to control flatness of the wafer.

A method for controlling flatness that can be performed using the inventive apparatus for controlling flatness will be described below.

<Apparatus for Forming Coating Film>

Next, the inventive apparatus for forming a coating film will be described.

The inventive apparatus for forming a coating film includes:

the inventive apparatus for controlling flatness; and a coating apparatus configured to apply a composition for forming a coating film on the wafer held and made flat by the apparatus for controlling flatness.

The inventive apparatus for controlling flatness described above can control flatness of the wafer sufficiently. The inventive apparatus for forming a coating film including such an apparatus for controlling flatness and the above-described coating apparatus make it possible to reduce the occurrence of variation in coating film thickness when a composition for forming a coating film is applied on the wafer.

Next, an embodiment of the inventive apparatus for forming a coating film will be described in detail with reference to the drawings.

FIG. 7 is a schematic cross-sectional view showing an example of the inventive apparatus for forming a coating film.

The apparatus 200 for forming a coating film shown in FIG. 7 includes an apparatus 100 for controlling flatness and a coating apparatus 6. The apparatus 100 for controlling flatness is the apparatus for controlling flatness 100, being an example of the present invention, shown in FIG. 1.

The apparatus 200 for forming a coating film shown in FIG. 7 further includes a vacuum chuck 4. The vacuum chuck 4 supports the holding member 1 in a manner that enables attachment and removal.

The holding member 1 can hold the wafer 5 on the holding surface 10. The apparatus 100 for controlling flatness can control flatness of the wafer 5, as explained above.

The coating apparatus 6 is configured to apply a composition for forming a coating film on the wafer 5.

When the controller 2 is configured to release adhesion of the dry adhesive fiber structures 12 to the wafer 5 in a part of the plurality of segments 11 of the holding surface 10 of the holding member 1 based on information on flatness of a reference wafer and information on a surface state of a reference coating film in addition to the information on flatness of the wafer 5 as described above, the controller 2 is preferably configured to control the above-described adhesion in accordance with the specifications of the coating apparatus 6 and coating conditions, for example.

A method for forming a coating film that can be performed using the inventive apparatus for forming a coating film will be described below.

<Method for Controlling Flatness>

Next, the inventive method for controlling flatness will be explained.

The inventive method for controlling flatness is a method for controlling flatness of a wafer, and includes the steps of:

providing a holding member having a holding surface including a plurality of segments, where each of the plurality of segments includes a dry adhesive fiber structure;

making the holding surface of the holding member adhere to a wafer to make the holding member hold the wafer;

obtaining information on flatness of the wafer by measuring flatness of the wafer; and releasing adhesion of the dry adhesive fiber structures to the wafer in a part of the plurality of segments of the holding surface of the holding member based on the information on flatness.

According to the inventive method for controlling flatness, flatness of the wafer can be controlled sufficiently by partially releasing adhesion of the dry adhesive fiber structures to the wafer based on the information on flatness of the wafer. By using a wafer whose flatness is controlled by the inventive method for controlling flatness, occurrence of variation in coating film thickness can be reduced when a composition for forming a coating film is applied on this wafer.

The inventive method for controlling flatness can, for example, be performed using the inventive apparatus for controlling flatness described above. However, the inventive method for controlling flatness can also be performed using an apparatus other than the inventive apparatus for controlling flatness.

Next, an embodiment of the inventive method for controlling flatness will be described in detail with reference to the drawings.

In the method for controlling flatness described below, the apparatus 100 for controlling flatness described with reference to FIG. 1 to FIG. 3 is used. Therefore, repetitive explanation will be omitted.

Firstly, the step of providing the holding member 1 shown in FIG. 1 to FIG. 3 is performed.

Next, the step of making the holding surface 10 of the holding member 1 adhere to a wafer 5 to make the holding member 1 hold the wafer 5 as shown in FIG. 2 is performed. In this event, the wafer 5 is adhered on the plurality of segments 11 shown in FIG. 3. The wafer 5 may be adhered on all the plurality of segments 11, or may be adhered on a part of the plurality of segments 11.

Meanwhile, the step of obtaining information on flatness of the wafer 5 by measuring flatness of the wafer 5 is performed.

The step of obtaining information on flatness can be a step of obtaining the information on flatness by measuring, for example, the flatness of the wafer 5 before being held by the holding member 1. In this case, the measurement equipment 3, described with reference to FIG. 4, can be used, or a measurement equipment separate from the apparatus 100 for controlling flatness can be used.

Alternatively, the step of obtaining information on flatness can be a step of obtaining the information on flatness by measuring the flatness of the wafer 5 in a state of being held by the holding member 1. In this case, too, the measurement equipment 3, described with reference to FIG. 4, can be used, or a measurement equipment separate from the apparatus 100 for controlling flatness can be used.

That is, the step of obtaining information on flatness may be performed before the step of making the holding member 1 hold the wafer 5, or may be performed after the step of making the holding member 1 hold the wafer 5.

The information on flatness of the wafer 5 preferably includes information on each of the plurality of divided regions 51 of the wafer 5.

Next, the step of releasing adhesion of the dry adhesive fiber structures 12 to the wafer 5 in a part of the plurality of segments 11 of the holding surface 10 of the holding member 1 based on the information on flatness of the wafer 5 is performed.

Flatness of the wafer 5 can be controlled sufficiently by this step. On the other hand, in a case where adhesion of the dry adhesive fiber structures 12 to the wafer 5 is released in all the segments out of the plurality of segments 11 that adhered to the wafer 5, flatness of the wafer 5 cannot be controlled.

A specific example of the step of releasing adhesion will be described with reference to FIG. 8.

FIG. 8 is a schematic cross-sectional view of an example of a state where adhesion of the holding member to the wafer shown in FIG. 2 is partly released. In FIG. 8, the outline of the wafer 5 before the partial release of the adhesion is shown with dotted lines, and the outline of the wafer after the partial release of the adhesion is shown with solid lines.

In this example, a step of judging a region 51a to be controlled that projects towards the holding surface 10 of the holding member 1 out of the plurality of divided regions 51 of the wafer 5 based on the information on flatness of the wafer 5 is further included.

Next, as shown in FIG. 8, the following step is performed in the step of releasing adhesion: a step of releasing adhesion of the dry adhesive fiber structures 12 to the wafer 5 in a segment 11a corresponding to the region 51a to be controlled out of the plurality of segments 11 of the holding member 1.

As shown in FIG. 8, by such a step of releasing adhesion, a difference in adhesion state occurs between the segments 11b not having the adhesion released and the segments 11a having the adhesion released out of the plurality of segments 11. Due to this difference, the regions 51a to be controlled of the wafer 5 move upwards, while other regions 51b move downwards. As a result, unevenness of the wafer 5 can be reduced further, and thus, flatness of the wafer 5 can be controlled more precisely.

In addition, it is also possible to control the adhesion state between the wafer 5 and the holding member 1 by the partial release of adhesion.

The step of judging a region 51a to be controlled and the step of releasing adhesion which are described above can be performed using the controller 2 shown in FIG. 1.

Furthermore, by using a holding member 1 having a holding surface 10 including a plurality of segments 11 arranged in a grid as shown in FIG. 3, flatness of the wafer 5 can be controlled more finely.

Furthermore, as explained above, by using a dry adhesive fiber structure including a plurality of microfibers and/or a plurality of nanofibers, partial release of the adhesion of the dry adhesive fiber structures to the wafer can be performed more easily.

Specific means for controlling adhesion and release thereof are not particularly limited. For example, as explained above with reference to FIG. 5, the adhesion and release thereof between the fibers 12a and the wafer 5 can be controlled for each fiber 12a by applying stress to the fibers 12a or relaxing or eliminating the stress on the fibers 12a through the each penetrating hole 13a in the base 13 and the each penetrating hole 14a in the carrier 14. Alternatively, it is also possible to apply a weak force on the regions 51a to be controlled of the wafer 5 to release the adhesion of the fibers 12a of the segment 11a.

<Method for Forming Coating Film>

Next, the inventive method for forming a coating film will be explained.

The inventive method for forming a coating film includes the steps of:
controlling flatness of the wafer by the inventive method for controlling flatness; and
applying a composition for forming a coating film on the wafer having the controlled flatness.

By applying a composition for forming a coating film on a wafer whose flatness is controlled by the inventive method for controlling flatness, it is possible to reduce occurrence of variation in coating film thickness when a composition for forming a coating film is applied.

Furthermore, the method preferably further includes the steps of:
providing a reference wafer and making the holding surface of the holding member adhere to an entire surface of the reference wafer facing the holding member to make the holding member hold the reference wafer;
obtaining information on flatness of the reference wafer by measuring flatness of the reference wafer in a state of being held by the holding member;
applying a composition for forming a coating film on the reference wafer in the state of being held by the holding member to form a reference coating film; and
obtaining information on a surface state of the reference coating film, where
in the step of releasing adhesion, adhesion of the dry adhesive fiber structures to the wafer is preferably released in a part of the plurality of segments of the holding surface of the holding member based on information on flatness of the reference wafer and information on the surface state of the reference coating film in addition to the information on flatness of the wafer.

According to such a method for forming a coating film, flatness of the wafer can be controlled even more sufficiently in accordance with coating conditions or the coating apparatus, for example. Thus, variation in the coating film thickness of the coating film formed on the wafer can be further suppressed, and a desired coating film can be formed with excellent reproducibility.

In addition, composition for forming a coating film is preferably applied by spin-coating.

By spin-coating the composition for forming a coating film, a flatter coating film can be formed, and as a result, occurrence of variation in coating film thickness can be further reduced.

A composition for forming a resist film, which particularly requires flatness, can be used as the composition for forming a coating film.

When a composition for forming a resist film is used as the composition for forming a coating film, a flat and uniform resist film can be formed. In particular, according to the inventive method for forming a coating film, a resist film having the occurrence of variation in coating film thickness reduced can be formed.

The formed resist film can be used as a coating film for lithography in monolayer or multilayer resist methods, for example. Accordingly, examples of the composition for forming a resist film include, for example: compositions for forming an upper layer resist film such as a photosensitive resist composition, an electron beam photosensitive resist composition, a directed self-assembly resist composition, a resist composition for nanoimprinting, and the like; a composition for forming a silicon-containing resist underlayer film; a composition for forming an organic underlayer film;

and the like. Note that the composition for forming a coating film used in the inventive method for forming a coating film is not limited to compositions for forming a resist film.

The inventive method for forming a coating film can be performed using, for example, the inventive apparatus for forming a coating film described earlier. However, the inventive method for forming a coating film can also be performed using an apparatus other than the inventive apparatus for forming a coating film.

Next, an embodiment of the inventive method for forming a coating film will be described with reference to the drawings.

The example of a method for forming a coating film described below uses the example of the apparatus 200 for forming a coating film described with reference to FIG. 7. Therefore, repetitive explanation will be omitted.

Firstly, using an apparatus 100 for controlling flatness, the step of controlling flatness of the wafer 5 by the inventive method for controlling flatness is performed.

Next, as shown in FIG. 9, in the lower part of the carrier 14 of the holding member 1, the holding member 1 is fixed using a vacuum chuck 4. Thus, stability of the wafer 5 during coating can be ensured.

Next, the step of applying a composition for forming a coating film on the wafer 5 having the controlled flatness is performed using a coating apparatus 6.

FIG. 10 is a schematic cross-sectional view showing a state where a composition for forming a coating film has been applied on the wafer 5 to form a coating film 7. FIG. 11 is a plane view of the coating film seen from direction A in FIG. 10.

Comparing FIG. 11 and FIG. 15 described above, it is revealed that the coating film 7 formed by employing the inventive method for forming a coating film has less unevenness than the chemically amplified resist film 9 formed by employing a conventional method. This is caused by the flatness of the wafer 5 having been controlled sufficiently by the inventive method for controlling flatness.

In addition, since the coating film 7 shown in FIGS. 10 and 11 has less unevenness than the chemically amplified resist film 9 formed by employing the conventional method, variation in coating film thickness is reduced.

When the coating film 7 is a resist film, occurrence of variation in coating film thickness, which has a harmful effect in photolithography, is suppressed in the resist film 7 thus formed. Consequently, this is suitable for fine patterning by photolithography with no variation in line width.

Note that, as explained above, the dry adhesive fiber structures 12 can not only adhere to an object that comes into contact with the tip, but can also release the adhesion to the object (attach and remove). Therefore, adhesion of the dry adhesive fiber structures 12 to the wafer 5 can be released in all segments 11 of the holding surface 10 of the holding member 1 after the coating film 7 has been formed, and thus, the wafer 5 can be taken off the holding member 1 easily.

Next, other variant example of the inventive method for forming a coating film will be described with reference to the drawings.

As a rule, the method for forming a coating film in this example differs from the example described above in that the method further includes a step of obtaining each of the information on flatness of the reference wafer and the information on the surface state of the reference coating film, and that in the step of releasing adhesion, adhesion of the dry adhesive fiber structures to the wafer is partially released based on information on flatness of the reference wafer and information on the surface state of the reference coating film in addition to the information on flatness of the wafer to be coated with the coating film.

In this example, firstly, the reference wafer 5' shown in FIG. 13 is provided. The reference wafer 5' is not particularly limited, but is preferably of the same material as the wafer 5 for forming the coating film on. Next, as shown in FIG. 12, the entire surface of the reference wafer 5' facing this holding member 1 is adhered to the holding surface 10 of the holding member 1 to make the holding member 1 hold the reference wafer 5'. Flatness of the reference wafer 5' in this state is measured to obtain information on flatness of the reference wafer 5'. This measurement can be performed by the same means as the means for obtaining the information on flatness of the wafer 5 described above.

Next, the composition for forming a coating film is applied using the coating apparatus 6 on the reference wafer 5' in this state by the same procedure as the procedure explained with reference to FIG. 9 and FIG. 10. Thus, the reference coating film 8 shown in FIG. 12 is formed on the reference wafer 5'.

The formed reference coating film 8 includes unevenness on the surface, as clearly seen in the plane view shown in FIG. 13, seen from direction B in FIG. 12. This unevenness may be, for example, a defect called haze that has a harmful effect in patterning by photolithography.

Next, information on the surface state of the formed reference coating film 8 is obtained. Information on the surface state of the reference coating film 8 can be obtained, for example, with an optical interference type film thickness meter or an ellipsometer type film thickness meter.

Subsequently, the reference wafer 5' is taken off the holding member 1. Next, a wafer 5 on which a coating film is to be formed is provided. Next, the entire surface of the wafer 5 facing this holding member 1 is adhered to the holding surface 10 of the holding member 1 to make the holding member 1 hold the wafer 5.

Next, in this example, using the controller 2, adhesion of the dry adhesive fiber structures 12 is released in a part of the plurality of segments 11 of the holding surface 10 of the holding member 1 based on the information on flatness of the reference wafer 5' and the information on the surface state of the reference coating film 8 which were obtained earlier in addition to the information on flatness of the wafer 5. This releasing of adhesion can be controlled in accordance with the specifications of the coating apparatus 6 and coating conditions.

Next, a composition for forming a coating film is applied by the same procedure as the procedure explained with reference to FIG. 9 and FIG. 10 using the coating apparatus 6 on the wafer 5 having the flatness controlled in the above-described manner. Thus, a coating film 7 having a reduced variation in coating film thickness similar to the coating film described with reference to FIG. 11 can be formed on the wafer 5.

According to the method for forming a coating film in this example, flatness of the wafer 5 can be controlled even more sufficiently in accordance with coating conditions or the coating apparatus. Thus, variation in the coating film thickness of the coating film 7 formed on the wafer 5 can be further suppressed, and a desired coating film 7 can be formed with excellent reproducibility. In this case, in order to reduce variation in the coating film, flatness of the wafer 5 is not necessarily controlled to be high.

In particular, according to the method for forming a coating film in this example, a coating film 7 having a defect that has been generated in the reference coating film 8 corrected can be formed.

EXAMPLE

Hereinafter, the present invention will be specifically described with reference to Examples and Comparative Examples. However, the present invention is not limited thereto.

Example 1

In Example 1, flatness of a wafer was controlled by the following procedure.

Firstly, an apparatus 100 for controlling flatness similar to the apparatus shown in FIG. 1 to FIG. 3 was provided. A holding surface 10 included one thousand segments 11 arranged in a grid as shown in FIG. 3. In addition, dry adhesive fiber structures 12 of a holding member 1 had the shape shown schematically in FIG. 5.

Next, a wafer 5, being an object to be controlled, was provided. The wafer 5 was a silicon wafer including one thousand divided regions 51.

This wafer 5 was adhered to the holding surface 10 of the holding member 1 as shown in FIG. 2 to make the holding member 1 hold the wafer 5.

In this state, the flatness of each of the divided regions 51 of the wafer 5 was measured to obtain information on flatness. The flatness of the wafer 5 was 0.4 micrometers.

Next, using a controller 2, regions 51a to be controlled that project towards the holding surface 10 of the holding member 1 were judged out of the plurality of divided regions 51 of the wafer 5 based on the obtained information on flatness.

Next, using the controller 2, adhesion of the dry adhesive fiber structures 12 to the wafer 5 in segments 11a corresponding to the regions 51a to be controlled was released out of the plurality of segments 11 of the holding member 1 as shown in FIG. 8. Release of adhesion was performed by pulling fibers 12 in segments 11a through penetrating holes 13a and 14a shown in FIG. 5. The flatness of the wafer 5 whose flatness was controlled in this manner was 0.02 micrometers.

Example 2

In Example 2, flatness of a wafer was controlled by the same procedure as Example 1 except for the following points.

In Example 2, flatness of the wafer 5 was measured to obtain information on flatness before being held by the holding member 1, and based on this information, flatness was controlled in the same manner as in Example 1. The flatness of the wafer 5 before being held by the holding member 1 was 0.01 micrometers. Note that in Example 2, a wafer similar to the wafer in Example 1 was used as the wafer 5.

The flatness of the wafer 5 whose flatness was controlled in Example 2 was 0.01 micrometers.

Example 3

In Example 3, a resist film was formed by the following procedure on the wafer 5 whose flatness was controlled in Example 1.

The holding member 1 was fixed with a vacuum chuck 4 as shown in FIG. 7 in a state where the wafer 5 whose flatness was controlled was held by the holding member 1.

Next, using a coating apparatus 6, a test composition for forming a coating film was applied on the wafer 5 in this state. A photoresist was used as the test composition for forming a coating film.

Next, the resultant was baked at 100° C. to form a resist film.

Example 4

In Example 4, a resist film was formed by the same procedure as Example 3 on the wafer 5 whose flatness was controlled in Example 2.

Comparative Example 1

In Comparative Example 1, a resist film was formed by the same procedure as Example 3 on a wafer 5 on which flatness control was not performed.

Note that as the wafer 5 used in Comparative Example 1, a wafer similar to the wafer 5 before controlling flatness used in Examples 1 and 2 was used.

Comparative Example 2

In Comparative Example 2, a wafer 5 was adhered to the holding member 1 to make the holding member 1 hold the wafer 5 by the same procedure as Example 1. Next, adhesion of the holding member 1 to the wafer 5 was released, and the wafer 5 was removed. The flatness of the removed wafer 5 was 0.6 micrometers. A resist film was formed by the same procedure as Example 3 on the wafer 5 obtained in this manner.

[Evaluation of Variation in Coating Film Thickness]

Variation in the coating film thickness of the resist films obtained in Examples 3 and 4 and Comparative Examples 1 and 2 was evaluated by the following procedure. Using an ellipsometer, 1000 points in the wafer surface were measured, and the maximum value and the minimum value of the measured value were determined. The following Table 1 shows the results.

TABLE 1

| | Variation in coating film thickness (difference between maximum value and minimum value) |
|---|---|
| Example 3 | 0.3A |
| Example 4 | 0.3A |
| Comparative Example 1 | 0.5A |
| Comparative Example 2 | 0.5A |

As shown in Table 1, it was revealed that in Examples 3 and 4, where a wafer whose flatness was controlled by the inventive method for controlling flatness (Examples 1 and 2) was used, occurrence of variation in coating film thickness when applying the composition for forming a resist film was successfully reduced.

On the other hand, in Comparative Examples 1 and 2, where a wafer whose flatness was not controlled was used, it was not possible to suppress the occurrence of variation in coating film thickness when forming the resist film.

Example 5

In Example 5, a resist film was formed by the same procedure as Example 3 on a wafer 5 whose flatness was controlled by the following procedure.

Firstly, a reference wafer similar to the wafer 5 used in Example 1 was provided. Next, this reference wafer was adhered to the holding member 1 to make the holding member 1 hold the reference wafer. In this state, flatness of the reference wafer was measured to obtain information on flatness of the reference wafer. The flatness of the reference wafer was 0.01 micrometers.

Next, a resist film, being a reference coating film, was formed on the reference wafer by the same procedure as Example 3. The surface state of the formed reference coating film was measured by the same procedure as described above to obtain information on the surface state of the reference coating film.

Next, another wafer 5 similar to the wafer 5 used in Example 1 was provided. Next, this wafer 5 was adhered to the holding member 1 to make the holding member 1 hold the wafer 5. In this state, flatness of the wafer 5 was measured to obtain information on flatness of the wafer 5. The flatness of this was 0.01 micrometers.

Next, regions to be controlled out of the plurality of divided regions 51 of the wafer 5 was judged based on the information on flatness of the reference wafer, the information on the surface state of the reference coating film, and the information on flatness of the wafer 5 obtained as described above. Next, using the controller 2, adhesion of the dry adhesive fiber structures 12 to the wafer 5 in segments corresponding to the regions to be controlled of the plurality of segments 11 of the holding member 1 was released. Release of adhesion was performed by pulling fibers 12 through penetrating holes 13a and 14a shown in FIG. 5 in segments corresponding to the regions to be controlled of the plurality of segments 11 of the holding member 1. Flatness of the wafer 5 was controlled in this manner.

A resist film was formed by the same procedure as Example 3 on the wafer 5 controlled in the above-described manner. Variation in the coating film thickness of the formed resist film was evaluated by the same procedure as Example 3.

The following Table 2 shows the result.

TABLE 2

| | Variation in coating film thickness (difference between maximum value and minimum value) |
|---|---|
| Example 5 | 0.1A |

It was revealed from the comparison of the result of Example 3 shown in Table 1 and the result of Example 5 shown in Table 2 that it was possible to reduce the occurrence of variation in coating film thickness even more than in Example 3 in Example 5, where control was performed based on the information on flatness of the reference wafer and the information on the surface state of the reference coating film in addition to the information on flatness of the wafer 5.

Note that in the above Examples, formation of a coating film, in particular, formation of a resist film was exemplified, adopting the inventive method for controlling flatness and apparatus for controlling flatness, but processing that adopts the inventive method for controlling flatness and apparatus for controlling flatness is not limited to formation of a coating film. For example, the inventive method for controlling flatness and apparatus for controlling flatness can be suitably adopted for processing that requires flatness of a wafer. In addition, the coating film formed adopting the inventive method for controlling flatness and apparatus for controlling flatness is not limited to resist films.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for controlling flatness of a wafer comprising the steps of:
   providing a holding member having a holding surface comprising a plurality of segments, wherein each of the plurality of segments comprises a dry adhesive fiber structure;
   making the holding surface of the holding member adhere to a wafer to make the holding member hold the wafer;
   obtaining information on flatness of the wafer by measuring flatness of the wafer; and
   releasing adhesion of the dry adhesive fiber structures to the wafer in a part of the plurality of segments of the holding surface of the holding member based on the information on flatness,
   wherein the step of obtaining the information on flatness is a step of measuring flatness of the wafer before being held by the holding member to obtain the information on flatness.

2. The method for controlling flatness according to claim 1, wherein as the dry adhesive fiber structure, a dry adhesive fiber structure comprising a plurality of microfibers and/or a plurality of nanofibers is used.

3. The method for controlling flatness according to claim 1, wherein:
   the wafer comprises a plurality of divided regions;
   the information on flatness of the wafer comprises information on flatness of each of the plurality of divided regions of the wafer;
   the method further comprises a step of judging a region to be controlled that projects towards the holding surface of the holding member out of the plurality of divided regions of the wafer based on the information on flatness; and
   the step of releasing adhesion is a step of releasing adhesion of the dry adhesive fiber structures to the wafer in a segment corresponding to the region to be controlled out of the plurality of segments of the holding member.

4. The method for controlling flatness according to claim 2, wherein:
   the wafer comprises a plurality of divided regions;
   the information on flatness of the wafer comprises information on flatness of each of the plurality of divided regions of the wafer;
   the method further comprises a step of judging a region to be controlled that projects towards the holding surface of the holding member out of the plurality of divided regions of the wafer based on the information on flatness; and
   the step of releasing adhesion is a step of releasing adhesion of the dry adhesive fiber structures to the wafer in a segment corresponding to the region to be controlled out of the plurality of segments of the holding member.

5. A method for forming a coating film on a wafer comprising the steps of:
   controlling flatness of the wafer by the method for controlling flatness according to claim 1; and
   applying a composition for forming a coating film on the wafer having the controlled flatness,
   the method further comprising the steps of:
   providing a reference wafer and making the holding surface of the holding member adhere to an entire surface of the reference wafer facing the holding member to make the holding member hold the reference wafer;
   obtaining information on flatness of the reference wafer by measuring flatness of the reference wafer in a state of being held by the holding member;
   applying a composition for forming a coating film on the reference wafer in the state of being held by the holding member to form a reference coating film; and
   obtaining information on a surface state of the reference coating film, wherein
   in the step of releasing adhesion, adhesion of the dry adhesive fiber structures to the wafer is released in a part of the plurality of segments of the holding surface of the holding member based on information on flatness of the reference wafer and information on the surface state of the reference coating film in addition to the information on flatness of the wafer.

6. The method for forming a coating film according to claim 5, wherein the composition for forming a coating film is applied by spin-coating.

7. The method for forming a coating film according to claim 5, wherein a composition for forming a resist film is used as the composition for forming a coating film.

8. A method for controlling flatness of a wafer comprising the steps of:
   providing a holding member having a holding surface comprising a plurality of segments, wherein each of the plurality of segments comprises a dry adhesive fiber structure;
   making the holding surface of the holding member adhere to a wafer to make the holding member hold the wafer;
   obtaining information on flatness of the wafer by measuring flatness of the wafer; and
   releasing adhesion of the dry adhesive fiber structures to the wafer in a part of the plurality of segments of the holding surface of the holding member based on the information on flatness,
   wherein:
   the wafer comprises a plurality of divided regions;
   the information on flatness of the wafer comprises information on flatness of each of the plurality of divided regions of the wafer;
   the method further comprises a step of judging a region to be controlled that projects towards the holding surface of the holding member out of the plurality of divided regions of the wafer based on the information on flatness; and
   the step of releasing adhesion is a step of releasing adhesion of the dry adhesive fiber structures to the wafer in a segment corresponding to the region to be controlled out of the plurality of segments of the holding member.

9. The method for controlling flatness according to claim 8, wherein the step of obtaining the information on flatness is a step of measuring flatness of the wafer in a state of being held by the holding member to obtain the information on flatness.

10. The method for controlling flatness according to claim 8, wherein as the dry adhesive fiber structure, a dry adhesive fiber structure comprising a plurality of microfibers and/or a plurality of nanofibers is used.

11. An apparatus for controlling flatness of a wafer comprising:
   a holding member having a holding surface comprising a plurality of segments, wherein each of the plurality of segments comprises a dry adhesive fiber structure, and the holding member is configured to hold a wafer by making the holding surface adhere to the wafer; and
   a controller configured to release adhesion of the dry adhesive fiber structures to the wafer in a part of the plurality of segments of the holding surface of the holding member based on information on flatness of the wafer,
   wherein:
   the wafer comprises a plurality of divided regions;
   the information on flatness of the wafer comprises information on flatness of each of the plurality of divided regions of the wafer; and
   the controller is configured
      to judge a region to be controlled that projects towards the holding surface of the holding member out of the plurality of divided regions of the wafer based on the information on flatness, and
      to release adhesion of the dry adhesive fiber structures to the wafer in a segment corresponding to the region to be controlled out of the plurality of segments of the holding member.

12. The apparatus for controlling flatness according to claim 11, further comprising a measurement equipment configured to measure flatness of the wafer to obtain the information on flatness of the wafer.

13. The apparatus for controlling flatness according to claim 11, wherein the dry adhesive fiber structure comprises a plurality of microfibers and/or a plurality of nanofibers.

14. An apparatus for forming a coating film, comprising:
   the apparatus for controlling flatness according to claim 13; and
   a coating apparatus configured to apply a composition for forming a coating film on the wafer held and made flat by the apparatus for controlling flatness,
   wherein:
   the controller is configured to release adhesion of the dry adhesive fiber structure to the wafer in a part of the plurality of segments of the holding surface of the holding member based on information on flatness of a reference wafer and information on a surface state of a reference coating film in addition to the information on flatness of the wafer;
   the information on flatness of the reference wafer is information on flatness of the reference wafer in a state where an entire surface of the reference wafer facing the holding member is adhered to the holding surface of the holding member; and
   the information on the surface state of the reference coating film is information on a surface state of a coating film formed by using the coating apparatus on the reference wafer in the state where the entire surface of the reference wafer facing the holding member is adhered to the holding surface of the holding member.

* * * * *